(12) United States Patent
Sung

(10) Patent No.: US 8,409,914 B2
(45) Date of Patent: Apr. 2, 2013

(54) METHOD FOR FABRICATING RESISTIVE MEMORY DEVICE

(75) Inventor: Min-Gyu Sung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/486,811

(22) Filed: Jun. 18, 2009

(65) Prior Publication Data

US 2010/0167463 A1    Jul. 1, 2010

(30) Foreign Application Priority Data

Dec. 29, 2008  (KR) .................. 10-2008-0135540

(51) Int. Cl.
*H01L 21/44* (2006.01)
(52) U.S. Cl. .. 438/104; 438/382; 438/685; 257/E21.476
(58) Field of Classification Search .................. 438/102, 438/104, 382, 584, 685, 210
See application file for complete search history.

(56) References Cited

U.S. PATENT DOCUMENTS

| | | | | |
|---|---|---|---|---|
| 6,951,780 | B1 * | 10/2005 | Herner | 438/128 |
| 7,666,789 | B2 * | 2/2010 | Choi et al. | 438/672 |
| 7,884,699 | B2 * | 2/2011 | Hosoi | 338/22 R |
| 2002/0172756 | A1 | 11/2002 | Joo et al. | |
| 2005/0002227 | A1 * | 1/2005 | Hideki et al. | 365/163 |
| 2008/0185687 | A1 | 8/2008 | Hong et al. | |
| 2008/0315174 | A1 * | 12/2008 | Kang et al. | 257/4 |
| 2009/0039332 | A1 * | 2/2009 | Lee et al. | 257/4 |
| 2009/0097300 | A1 * | 4/2009 | Ishihara et al. | 365/148 |
| 2009/0233453 | A1 * | 9/2009 | Mani et al. | 438/772 |
| 2009/0250678 | A1 * | 10/2009 | Osano et al. | 257/2 |
| 2009/0273964 | A1 * | 11/2009 | Yamazaki et al. | 365/148 |
| 2010/0085142 | A1 * | 4/2010 | Hosoi | 338/20 |

FOREIGN PATENT DOCUMENTS

| | | |
|---|---|---|
| CN | 101238582 | 8/2008 |
| JP | 04-242969 | 8/1992 |
| JP | 2004-266263 | 9/2004 |
| KR | 1020060046809 | 5/2006 |
| KR | 100593750 | 6/2006 |
| KR | 1020100031698 | 3/2010 |
| TW | 200737187 | 10/2007 |
| TW | 200807689 | 2/2008 |
| TW | 200849566 | 12/2008 |

OTHER PUBLICATIONS

Notice of Preliminary Rejection issued from Korean Intellectual Property Office on Oct. 26, 2010.
K. Kinoshita et al., "Bias polarity dependent data retention of resistive random access memory consisting of binary transition metal oxide," Applied Physics Letters, Sep. 6, 2006, 89,103509,American Institute of Physics, 2006.
Notice of Preliminary Rejection issued from Korean Intellectual Property Office on Apr. 13, 2011.
Notice of Allowance issued from Korean Intellectual Property Office on Feb. 3, 2012.

(Continued)

*Primary Examiner* — Savitr Mulpuri
(74) *Attorney, Agent, or Firm* — IP & T Group LLP

(57) ABSTRACT

A method for fabricating a resistive memory device includes forming a lower electrode including a metal nitride layer over a substrate, forming a metal oxide layer used as a variable resistance material by oxidizing a part of the metal nitride layer, and forming an upper electrode on the metal oxide layer.

15 Claims, 7 Drawing Sheets

OTHER PUBLICATIONS

Office Action issued by the Chinese Patent Office on Mar. 26, 2012.
Notice of Allowance issued by the Taiwanese Intellectual Property Office on Nov. 30, 2012.

* cited by examiner

US 8,409,914 B2

METHOD FOR FABRICATING RESISTIVE MEMORY DEVICE

CROSS-REFERENCE TO RELATED APPLICATIONS

The present invention claims priority of Korean patent application number 10-2008-0135540, filed on Dec. 29, 2008, the disclosure which is incorporated herein by reference in its entirety.

BACKGROUND OF THE INVENTION

The present invention relates to a method for fabricating a memory device, and more particularly, to a method for fabricating a resistive memory device using the resistance variation depending on a supplied voltage such as a non-volatile resistive random access memory (ReRAM).

Recently, studies on next generation memory devices substitutable for a dynamic random access memory (DRAM) and a flash memory are actively being performed.

One of the next generation memory devices is a resistive memory device including a variable resistance material that has the resistance sharply changed according to a voltage supplied thereto and thus switches between at least two different resistance states. The resistive memory device stores different data, e.g., bit data '0' or '1', using the resistance variation of the variable resistance material.

FIG. 1A illustrates a view showing a structure of a conventional resistive memory device, and FIG. 1B illustrates a graph representing a current/voltage characteristic of the resistive memory device described in FIG. 1A.

As illustrated in FIG. 1A, the conventional resistive memory device includes one transistor A used as a switching element and one resistance element B used as a storing element. Herein, the resistance element B includes a lower electrode 11, an upper electrode 13 and a variable resistance material 12 disposed between the lower electrode 11 and the upper electrode 13.

Each of the lower electrode 11 and the upper electrode 13 may include one selected from a group consisting of aluminum (Al), platinum (Pt), ruthenium (Ru), iridium (Ir), nickel (Ni), titanium nitride (TiN), titanium (Ti), cobalt (Co), chromium (Cr), tungsten (W), copper (Cu) and an alloy thereof.

The variable resistance material 12 includes a binary oxide such as a transition metal oxide, e.g., NiO, $TiO_2$, HfO, $Nb_2O_5$, ZnO, $ZrO_2$, $WO_3$ or CoO, or a perovskite series material, e.g., STO (SrTiO), PCMO (PrCaMnO) or GST (GeSbTe). Moreover, a metal oxynitride such as TiON was recently turned out to have a characteristic of the variable resistance material.

According to a voltage supplied between the lower electrode 11 and the upper electrode 13, the conventional resistive memory device shows the current/voltage characteristic described in FIG. 1B.

As shown in FIG. 1B, if the supplied voltage is lower than A1 or greater than A2, the resistive memory device shows a current/voltage characteristic following a B1 curve. Meanwhile, if the supplied voltage is between A1 and A2, the resistive memory device shows a current/voltage characteristic following a B2 curve.

Therefore, if a certain read voltage A3 lower than A1 is supplied to the resistance element B after a voltage between A1 and A2 is supplied, there is measured a current following the B2 curve. On the other hand, if the certain read voltage A3 lower than A1 is supplied to the resistance element B after a voltage greater than A2 is supplied, there is measured a current following the B1 curve.

After all, a value of a current outputted in a reading operation is changed according to a voltage supplied between the upper electrode and the lower electrode. That is, the resistive memory device shows different resistance states according to the variation of the voltage supplied between the upper electrode and the lower electrode.

FIGS. 2A to 2C illustrate cross-sectional views of a method for fabricating a conventional resistive memory device.

Referring to FIG. 2A, a lower electrode 21 is formed over a substrate (not shown) where a certain underlying structure is formed.

Then, as illustrated in FIG. 2B, a variable resistance material layer 22 is formed on the lower electrode 21.

Herein, before forming the variable resistance material layer 22, a cleaning process may be additionally performed to remove foreign substance existing on an interface of the lower electrode 21 and the variable resistance material layer 22.

Referring to FIG. 2C, an upper electrode 23 is formed on the variable resistance material layer 22.

However, the method for fabricating the conventional resistive memory device has the following problems.

First of all, an interface characteristic of the lower electrode and the upper electrode is important in securing the characteristic as the resistive memory device. In particular, no foreign substance should be on the interface of the lower electrode and the variable resistance material layer. For this purpose, a separate cleaning process should be performed between a process of depositing the lower electrode and a process of depositing the variable resistance material layer.

Further, at least three deposition processes are required to fabricate the resistive memory device, wherein the deposition processes include the process of depositing the lower electrode, the process of depositing the variable resistance material layer and a process of depositing the upper electrode.

Therefore, a technology for improving a characteristic of a device as well as employing a simpler fabricating process than the method for fabricating the conventional resistive memory device may be useful.

SUMMARY OF THE INVENTION

Exemplary embodiments of the present invention are directed to providing a method for fabricating a resistive memory device capable of improving a characteristic of the device and employing a simplified fabricating process.

In accordance with an aspect of the present invention, there is provided a method for fabricating a resistive memory device, the method including: forming a lower electrode including a metal nitride layer over a substrate; forming a metal oxide layer used as a variable resistance material by oxidizing a part of the metal nitride layer; and forming an upper electrode on the metal oxide layer.

In accordance with another aspect of the present invention, there is provided a method for fabricating a resistive memory device, the method including: forming a lower electrode over a substrate; forming a variable resistance material layer on the lower electrode by supplying an oxygen gas into a chamber where the lower electrode is deposited; and forming an upper electrode on the variable resistance material layer.

In accordance with still another aspect of the present invention, there is provided a method for fabricating a resistive memory device, the method including: forming a lower electrode over a substrate, wherein the lower electrode includes a material whose oxidation is suppressed in a selective oxidation process; forming a material layer on the lower electrode, wherein the material layer is prone to being oxidized in the selective oxidation process; forming a variable resistance material layer by selectively oxidizing the material layer through the selective oxidation process; and forming an upper electrode on the variable resistance material layer.

DESCRIPTION OF SPECIFIC EMBODIMENTS

Figure 1A:
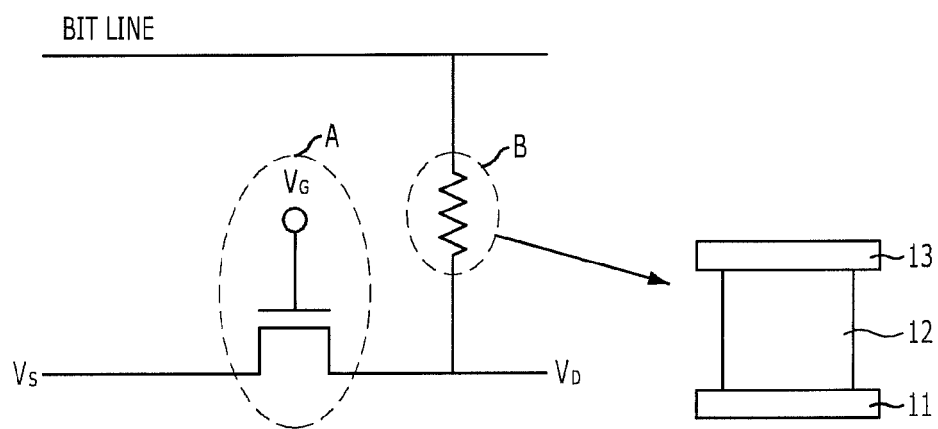
FIG. 1A illustrates a view showing a structure of a conventional resistive memory device.
Figure 1B:
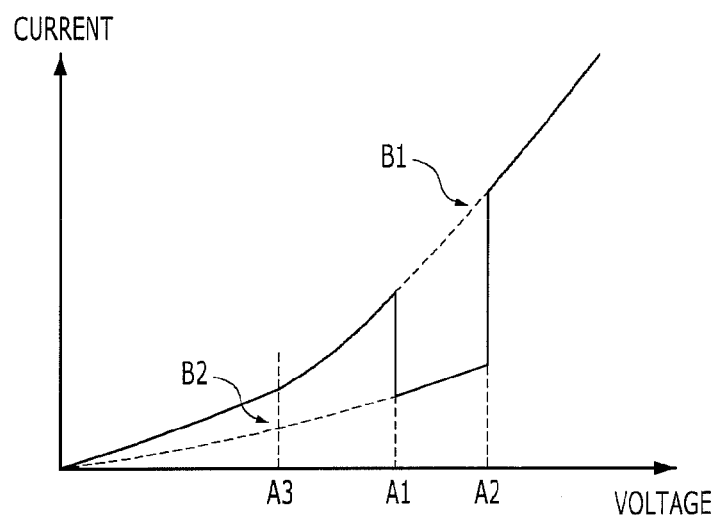
FIG. 1B illustrates a graph representing a current/voltage characteristic of the resistive memory device described in FIG. 1A.
Figure 2A:
FIGS. 2A to 2C illustrate cross-sectional views of a method for fabricating a conventional resistive memory device.
Figure 2B:
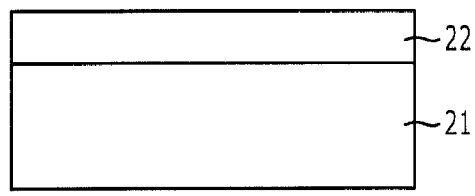
Figure 2C:
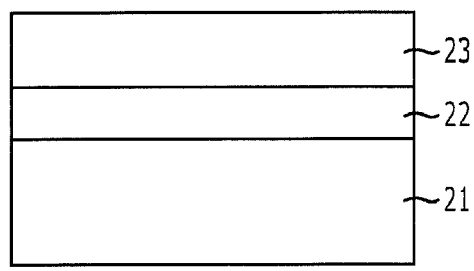

Other objects and advantages of the present invention can be understood by the following description, and become apparent by describing the embodiments of the present invention.

In the figures, the dimensions of layers and regions may be illustrative only and may not be exactly shown. Like reference numerals refer to like elements throughout. It will also be understood that when a layer, a film, a region or a plate is referred to as being 'on' another one, it can be directly on the other one, or one or more intervening layers, films, regions or plates may also be present.

Figure 3A:
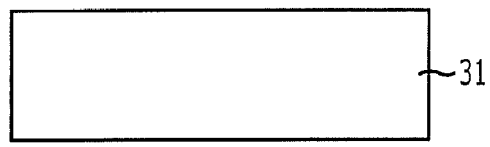
FIGS. 3A to 3C illustrate cross-sectional views of a method for fabricating a resistive memory device in accordance with a first embodiment of the present invention.
Figure 3B:
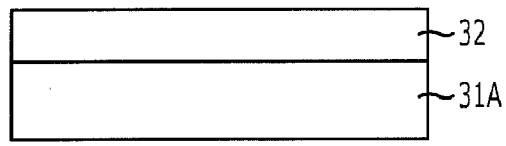
Figure 3C:
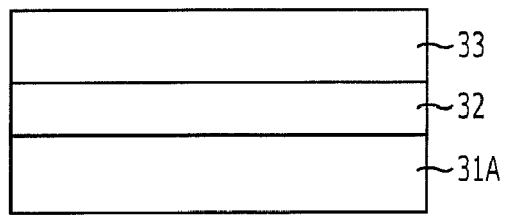

FIGS. 3A to 3C illustrate cross-sectional views of a method for fabricating a resistive memory device in accordance with a first embodiment of the present invention.

Referring to FIG. 3A, a metal nitride layer 31 used as a lower electrode of the resistive memory device is formed over a substrate (not shown) where a certain underlying structure is formed. Herein, the metal nitride layer 31 may include a tungsten nitride (WN) layer, a tantalum nitride (TaN) layer, a titanium nitride (TiN) layer or a molybdenum nitride (MoN) layer. Moreover, the metal nitride layer 31 is formed through a deposition process, e.g., a physical vapor deposition (PVD) process, a chemical vapor deposition (CVD) process or an atomic layer deposition (ALD) process.

The reason why the metal nitride layer 31 is used as the lower electrode is that facilitates adjusting a thickness of a variable resistance material layer to be formed by a subsequent oxidation process. This will be described later.

Referring to FIG. 3B, a metal oxide layer 32 used as the variable resistance material layer is formed by oxidizing a part of the metal nitride layer 31. The oxidation process may be performed using an oxygen gas. As described above, in case the metal nitride layer 31 includes the WN layer, the TaN layer, the TiN layer or the MoN layer, the metal oxide layer 32 may include a tungsten oxide ($WO_x$) layer, a tantalum oxide ($TaO_x$) layer, a titanium oxide ($TiO_x$) layer, or a molybdenum oxide ($MoO_x$) layer, x being a positive integer. Herein, a reference numeral 31A represents the metal nitride layer remaining without being oxidized in the above oxidation process.

Meanwhile, in general, it is preferable that the thickness of the variable resistance material layer is relatively small in the resistive memory device. By having the thickness to be small, the process of fabricating the resistive memory device is made easier and degree of integration is improved. Further, it is easier to secure a smaller switching current of the variable resistance material layer than a channel current of a transistor whose size is reduced.

In the meantime, in case of using a metal such as Al, Pt, Ru, Ir, Ni, Ti, Co, Cr, W, Cu or an alloy thereof as the lower electrode, it may be difficult to form the variable resistance material layer by oxidizing the part of the lower electrode. Since an oxidation rate of such metal is high, it may be difficult to accurately adjust a thickness of the metal oxide layer. In particular, it may be difficult to adjust the thickness of the metal oxide layer to be thin and uniform.

On the other hand, when using the metal nitride layer 31 as the lower electrode as in the first embodiment of the present invention, the oxidation is slowly performed by having the nitride to be decomposed during the process of forming the metal oxide layer 32 due to oxidizing of the metal nitride layer 31. Therefore, it is relatively easier to more finely adjust the thickness of the metal oxide layer 32. Specially, the thickness of the metal oxide layer 32 can be adjusted to a level equal to or smaller than 100 nm.

As illustrated in FIG. 3C, an upper electrode 33 is formed on the metal oxide layer 32. Herein, the upper electrode 33 may be formed with a metal or a metal nitride. For instance, the upper electrode 33 may include Al, Pt, Ru, Ir, Ni, TiN, Ti, Co, Cr, W, Cu, zirconium (Zr), hafnium (Hf) or an alloy thereof. As to a metal nitride forming the upper electrode 33, a tungsten nitride (WN). tantalum nitride (TaN), titanium nitride (TiN), and a molybdenum nitride (MoN) have already been introduced above as metal nitrides in connection with the metal nitride layer 31. Furthermore, the upper electrode 33 may be formed through the PVD process, the CVD process or the ALD process.

Figure 4:
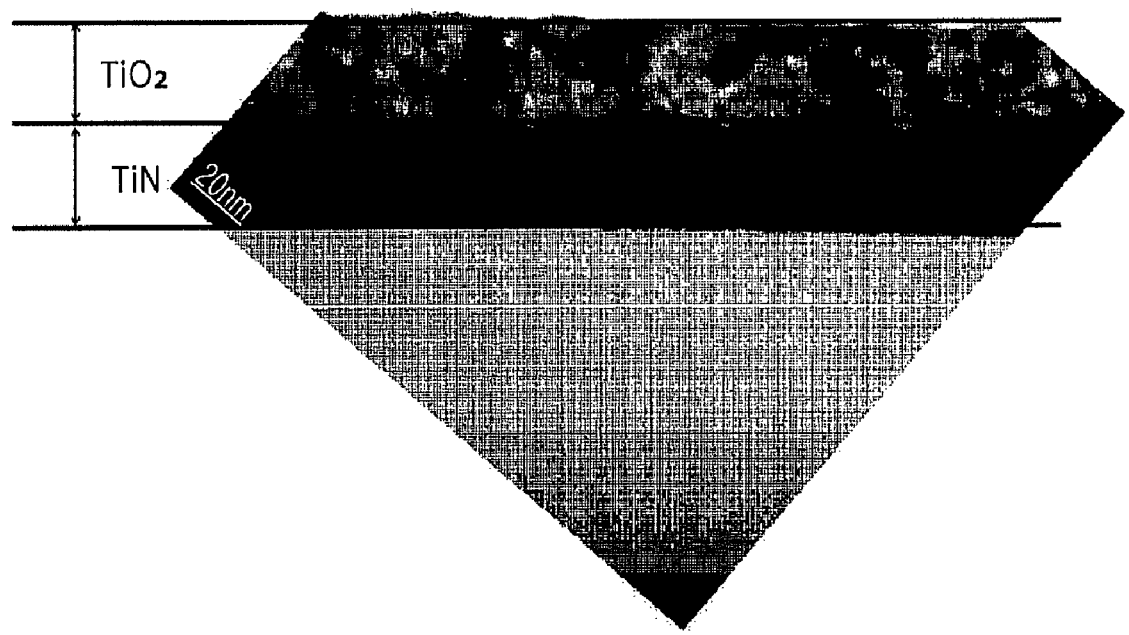
FIG. 4 illustrates a structure formed according to the method for fabricating the resistive memory device in accordance with the first embodiment of the present invention.
Figure 5A:
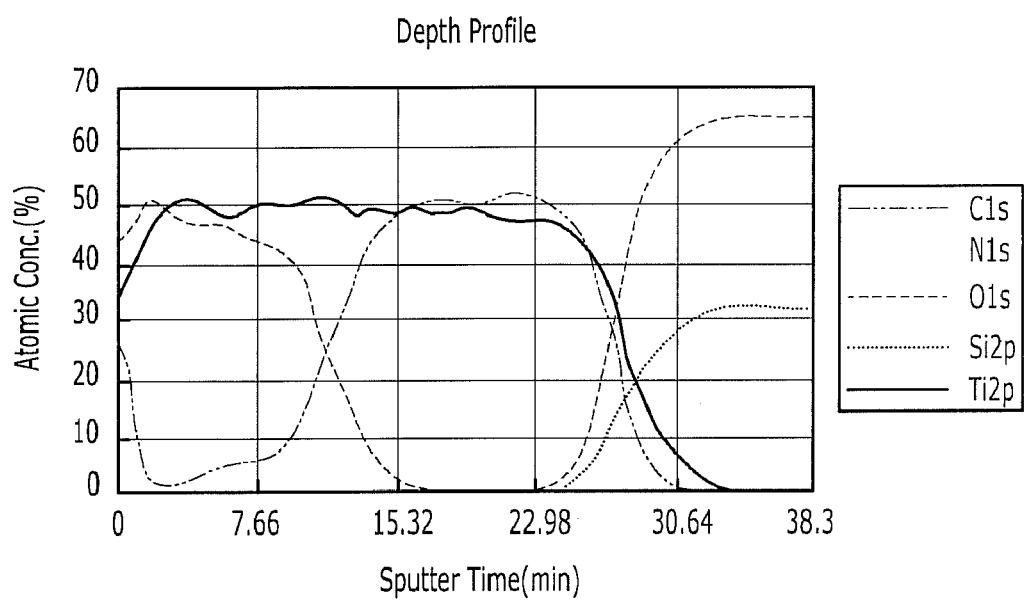
FIG. 5A illustrates an X-ray photoelectron spectroscopy depth profile of the structure described in FIG. 4.
Figure 5B:
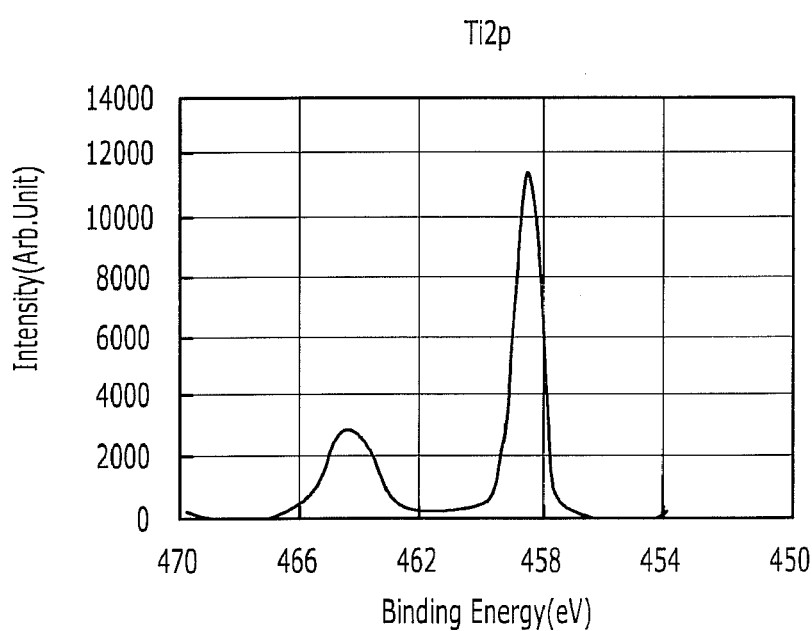
FIG. 5B illustrates an XPS spectrum of the structure described in FIG. 4.

FIGS. 4, 5A and 5B illustrate a structure formed according to the method for fabricating the resistive memory device in accordance with the first embodiment of the present invention. In particular, they show a structure formed by an experiment where the oxidation is performed by supplying an oxygen gas of 45 standard liter per minute (slm) at a temperature of 500° C. for 30 minutes after depositing a TiN layer for the lower electrode to have a thickness of approximately 500 Å by performing the PVD process. In this experiment, an oxidation rate of the TiN layer is low as much as 8 Å/min.

FIG. 4 illustrates a cross-sectional view of the structure formed by the experiment.

Referring to FIG. 4, it is noted that a $TiO_2$ layer that is a variable resistance material was formed by oxidizing to approximately half the thickness of the TiN layer uniformly. That is, the $TiO_2$ layer of approximately 250 Å is uniformly formed on the TiN layer of approximately 250 Å.

FIG. 5A illustrates an X-ray photoelectron spectroscopy (XPS) depth profile of the structure formed by the experiment, and FIG. 5B illustrates an XPS spectrum of the structure formed by the experiment.

Referring to FIGS. 5A and 5B, it is confirmed that the $TiO_2$ layer is formed by oxidizing the TiN layer.

In employing the method for fabricating the resistive memory device in accordance with the first embodiment of the present invention, since the variable resistance material layer is formed by oxidizing a part of the lower electrode, a separate process of depositing the variable resistance material is not required unlike in the prior art. Further, a separate cleaning process is not required since the formation of foreign substance on the interface of the lower electrode and the variable resistance material layer is blocked/avoided from the beginning. As a result, the process of fabricating the resistive memory device may be simplified and a characteristic of the device may be improved. Moreover, since the metal nitride layer having a low oxidation rate is used as the lower electrode, a thin and uniform metal oxide layer may be formed.

Figure 6A:
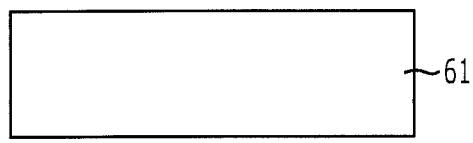
FIGS. 6A to 6C illustrate cross-sectional views of a method for fabricating a resistive memory device in accordance with a second embodiment of the present invention.
Figure 6B:
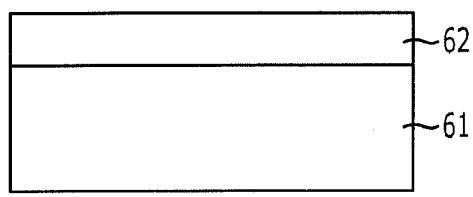
Figure 6C:
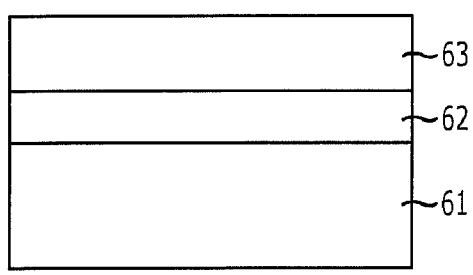

FIGS. 6A to 6C illustrate cross-sectional views of a method for fabricating a resistive memory device in accordance with a second embodiment of the present invention.

Referring to FIG. 6A, a lower electrode 61 is formed over a substrate (not shown) where an underlying structure is formed. The lower electrode 61 may include a metal nitride layer such as a WN layer, a TaN layer, a TiN layer or a MoN layer, or a metal layer such as Al, Pt, Ru, Ir, Ni, Ti, Co, Cr, W, Cu or an alloy thereof. The lower electrode 61 may be formed by performing a deposition process. Preferably, the deposition process uses the PVD process.

Referring to FIG. 6B, a variable resistance material layer 62 is formed on the lower electrode 61 by continuously supplying an oxygen gas into a chamber where the lower electrode 61 is formed. Herein, if the lower electrode 61 is formed with the metal nitride layer, the variable resistance material layer 62 is formed with a metal oxynitride layer such as a WON layer, a TaON layer, a TiON layer or a MoON layer. If the lower electrode 61 is formed with the metal layer, the variable resistance material layer 62 is formed with a metal oxide layer such as an $Al_2O_3$ layer or a $RuO_2$ layer.

In particular, in case the lower electrode 61 is deposited by the PVD process, when continuously supplying the oxygen gas into the chamber where the lower electrode 61 is formed, the variable resistance material layer 62 including the metal oxynitride layer or the metal oxide layer is formed by reactive sputtering.

Referring to FIG. 6C, an upper electrode 63 is formed on the variable resistance material layer 62. The upper electrode 63 may include a metal or a metal nitride. For instance, the upper electrode 63 may include Al, Pt, Ru, Ir, Ni, TiN, Ti, Co, Cr, W, Cu, Zr, Hf or an alloy thereof. Moreover, the upper electrode 63 may be formed through the PVD process, the CVD process or the ALD process.

Specially, it is preferable that the upper electrode 63 is formed with the same material as that of the lower electrode 61. In this case, since all of the process of forming the lower electrode 61, the process of forming the variable resistance material layer 62 and the process of forming the upper electrode 63 may be sequentially performed in the same chamber, the manufacturing time may be reduced.

As described above, in employing the method for fabricating the resistive memory device in accordance with the second embodiment of the present invention, since the variable resistance material layer can be formed using the chamber where the lower electrode is formed, e.g., a PVD chamber, the processing time and costs may be reduced. Further, since the formation of foreign substance on the interface of the lower electrode and the variable resistance material layer is blocked from the beginning, a separate cleaning process may not be required. As a result, the process of fabricating the resistive memory device may be simplified and the characteristic of the device may be improved. Moreover, in case of forming the lower electrode and the upper electrode with the same material, the processing time is minimized since the processes of forming the lower electrode, the variable resistance material layer and the upper electrode can be sequentially performed in the same chamber.

FIGS. 7A to 7D illustrate cross-sectional views of a method for fabricating a resistive memory device in accordance with a third embodiment of the present invention.

Figure 7A:
FIGS. 7A to 7D illustrate cross-sectional views of a method for fabricating a resistive memory device in accordance with a third embodiment of the present invention.

Referring to FIG. 7A, a lower electrode 71 is formed over a substrate (not shown) where a certain underlying structure is formed. Herein, the lower electrode 71 includes a material whose oxidation is suppressed in a selective oxidation process, e.g., a metal layer such as a W layer, a TiN layer or a Mo layer, or a metal nitride layer. Moreover, the lower electrode 71 may be formed through a deposition process such as the PVD process, the CVD process or the ALD process. The selective oxidation process will be described in detail hereinafter.

The selective oxidation process is a process of eventually suppressing the oxidation of a metal by inducing oxidation/deoxidation reaction of the metal in a $H_2$ rich oxidation atmosphere, e.g., a $H_2/O_2$ atmosphere or a $H_2O/H_2$ atmosphere. In a process of forming a gate pattern including a polysilicon layer and a metal layer that are stacked, this selective oxidation process is usually used to prevent the metal layer from being oxidized in a process of re-oxidizing a gate to recover the etch loss after etching the polysilicon layer and the metal layer. That is, when performing the selective oxidation process after etching the stacked structure of the metal layer, e.g., a W layer, whose oxidation is suppressed in the selective oxidation process, and the polysilicon layer to form the gate pattern, the metal layer is not oxidized while the polysilicon layer and a silicon substrate are oxidized.

In the above-described manner, using the metal nitride layer or the metal layer whose oxidation is suppressed in the selective oxidation process for the lower electrode 71 is to form a subsequent variable resistance material layer through the selective oxidation process. This will be described later.

Figure 7B:
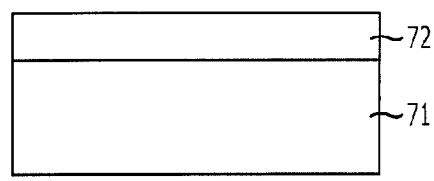

Referring to FIG. 7B, a material layer 72 able to be oxidized in the selective oxidation process is formed on the lower electrode 71. The material layer 72 may include a metal layer such as Al, Pt, Ru, Ir, Ni, TiN, Ti, Co, Cu, Zr or Hf, or a metal nitride layer. Further, the material layer 72 may be formed through a deposition process such as the PVD process, the CVD process or the ALD process.

As a result of the above-described processes, there is formed a stacked structure of the lower electrode 71 including the material whose oxidation is suppressed in the selective oxidation process and the material layer 72 prone to being oxidized. Herein, in the selective oxidation process for the stacked structure of two layers, one layer may be relatively prone to being oxidized and the oxidation of the other layer may be relatively suppressed as compared to the first layer. For instance, although the TiN layer is generally a material whose oxidation is suppressed, in the stacked structure of the W layer and the TiN layer, the oxidation of the W layer may be suppressed and the TiN layer may be prone to being oxidized, as compared to the suppressed material, in the selective oxidation process.

Figure 7C:
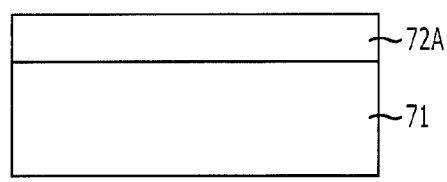

Referring to FIG. 7C, by performing the selective oxidation process on the stacked structure of the lower electrode 71 and the material layer 72, there is formed a variable resistance material layer 72A made of a metal oxide layer formed by oxidizing the material layer 72 only.

As described above, the selective oxidation process is performed in the $H_2$ rich oxidation atmosphere. For example, the selective oxidation process may be performed in an $O_2/H_2$ gas or plasma atmosphere in an in-situ steam generation (ISSG) method or in a $H_2O/H_2$ gas or plasma atmosphere in a water vapor generation (WVG) method. In case the selective oxidation process is performed in the gas atmosphere, it is preferably performed at a temperature higher than 800° C. However, in case the selective oxidation process is performed in the plasma atmosphere, it may be performed at a temperature higher than 400° C.

Figure 7D:
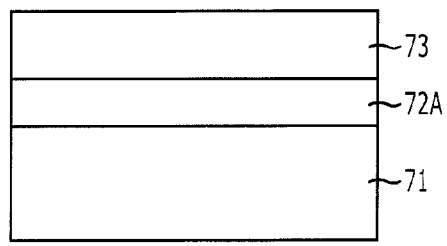

Referring to FIG. 7D, an upper electrode 73 is formed on the variable resistance material layer 72A. The upper electrode 73 may include a metal or a metal nitride. For instance, the upper electrode 73 may include Al, Pt, Ru, Ir, Ni, TiN, Ti, Co, Cr, W, Cu, Zr, Hf or an alloy thereof. Further, the upper electrode 73 may be formed through the PVD process, the CVD process or the ALD process.

In the above-described manner, in employing the method for fabricating the resistive memory device in accordance with the third embodiment of the present invention, since the material whose oxidation is suppressed in the selective oxidation process is used as the lower electrode and the variable resistance material layer is formed by selectively oxidizing the metal on the lower electrode, the processes may be performed relatively easily. Further, since abnormal oxidation of the lower electrode may be suppressed and thus the degradation of the interface of the lower electrode and the variable resistance material layer may be controlled, the characteristic of the device may be improved.

The inventive method for fabricating the resistive memory device may improve the characteristic of the device as well as simplifying its fabricating process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a resistive memory device, the method comprising:
   forming a lower electrode including a metal nitride layer over a substrate, wherein the metal nitride layer comprises one selected from a tungsten nitride (WN) layer, a tantalum nitride (TaN) layer, a molybdenum nitride (MoN) layer and a combination thereof;
   forming a metal oxide layer used as a variable resistance material by oxidizing a part of the metal nitride layer; and
   forming an upper electrode on the metal oxide layer, wherein the upper electrode includes a metal nitride layer.

2. The method of claim 1, wherein the oxidation process is performed using an oxygen gas.

3. A method for fabricating a resistive memory device, the method comprising:
   forming a lower electrode over a substrate, wherein the lower electrode comprises one selected from a tungsten nitride (WN) layer, a tantalum nitride (TaN) layer, a molybdenum nitride (MoN) layer and a combination thereof;
   forming a variable resistance material layer on the lower electrode by supplying an oxygen gas into a chamber where the lower electrode is deposited; and
   forming an upper electrode on the variable resistance material layer, wherein the upper electrode includes a metal nitride layer.

4. The method of claim 3, wherein forming the lower electrode is performed by employing a physical vapor deposition (PVD) method.

5. The method of claim 4, wherein forming the variable resistance material layer is performed by employing a reactive sputtering method through the supply of the oxygen gas.

6. The method of claim 3, wherein the upper electrode is formed with the same material as that of the lower electrode.

7. The method of claim 6, wherein forming the lower electrode, forming the variable resistance material layer and forming the upper electrode are performed in the same chamber.

8. A method for fabricating a resistive memory device, the method comprising:
   forming a lower electrode over a substrate, wherein the lower electrode includes a material whose oxidation is suppressed in a selective oxidation process, wherein the lower electrode comprises a tungsten (W), a molybdenum (Mo) layer or a combination thereof;
   forming a material layer on the lower electrode, wherein the material layer is prone to being oxidized in the selective oxidation process;
   forming a variable resistance material layer by selectively oxidizing the material layer through the selective oxidation process, wherein the selective oxidation process is performed in a $H_2$ rich oxidation atmosphere, wherein the variable resistance material layer comprises metal oxide selected from a tungsten oxynitride (WON) layer, a tantalum oxynitride (TaON) layer, a molybdenum oxynitride (MOON) layer and a combination thereof; and
   forming an upper electrode on the variable resistance material layer.

9. The method of claim 8, wherein the material layer comprises a metal layer or a metal nitride layer.

10. The method of claim 8, wherein forming a variable resistance material layer comprises forming a variable resistance material layer by selectively oxidizing the material layer at a temperature higher than 800° C. through the selective oxidation process.

11. The method of claim 8, wherein the selective oxidation process is performed in a $H_2/O_2$ gas or plasma atmosphere.

12. The method of claim 8, wherein the selective oxidation process is performed in a $H_2O/_2$ gas or plasma atmosphere.

13. The method of claim 8, wherein the material layer on the lower electrode is more prone to being oxidized than the lower electrode.

14. The method of claim 1, wherein the upper electrode comprises one selected from a tungsten nitride (WN) layer, a tantalum nitride (TaN) layer, a molybdenum nitride (MoN) layer and a combination thereof.

15. The method of claim 1, wherein, in the forming of the metal oxide layer, the metal nitride layer of the lower electrode is oxidized to about half the thickness of the metal nitride layer of the lower electrode.

* * * * *